United States Patent [19]
Evertt et al.

[11] Patent Number: 5,946,258
[45] Date of Patent: Aug. 31, 1999

[54] PUMP SUPPLY SELF REGULATION FOR FLASH MEMORY CELL PAIR REFERENCE CIRCUIT

[75] Inventors: Jeff Evertt; Kerry Tedrow, both of Folsom, Calif.

[73] Assignee: Intel Corporation, Santa Clara, Calif.

[21] Appl. No.: 09/040,523

[22] Filed: Mar. 16, 1998

[51] Int. Cl.$^6$ ..................................................... G11C 7/00
[52] U.S. Cl. ..................... 365/226; 365/210; 327/536
[58] Field of Search ............................... 365/226, 189.09, 365/210; 327/536, 537, 147, 148, 156, 157, 158

[56] References Cited

U.S. PATENT DOCUMENTS

| | | | |
|---|---|---|---|
| 5,339,272 | 8/1994 | Tedrow et al. | 365/189.09 |
| 5,414,669 | 5/1995 | Tedrow et al. | 365/226 |
| 5,553,295 | 9/1996 | Pantelakis et al. | 395/750 |
| 5,757,170 | 5/1998 | Pinney | 327/538 |
| 5,812,017 | 9/1998 | Golla et al. | 327/536 |
| 5,835,420 | 11/1998 | Lee et al. | 365/189.09 |

*Primary Examiner*—David Nelms
*Assistant Examiner*—Anh Phung
*Attorney, Agent, or Firm*—Peter Lam

[57] ABSTRACT

An integrated circuit arrangement which provides a self regulated pump supply for a flash EEPROM memory cell pair reference circuit. The integrated circuit arrangement comprises: a charge pump circuit; a source of reference voltages; a comparator for comparing an output of the charge pump with a reference voltage and for operating the charge pump based on its output; and a pass device for coupling an output of the charge pump to the comparator.

24 Claims, 5 Drawing Sheets

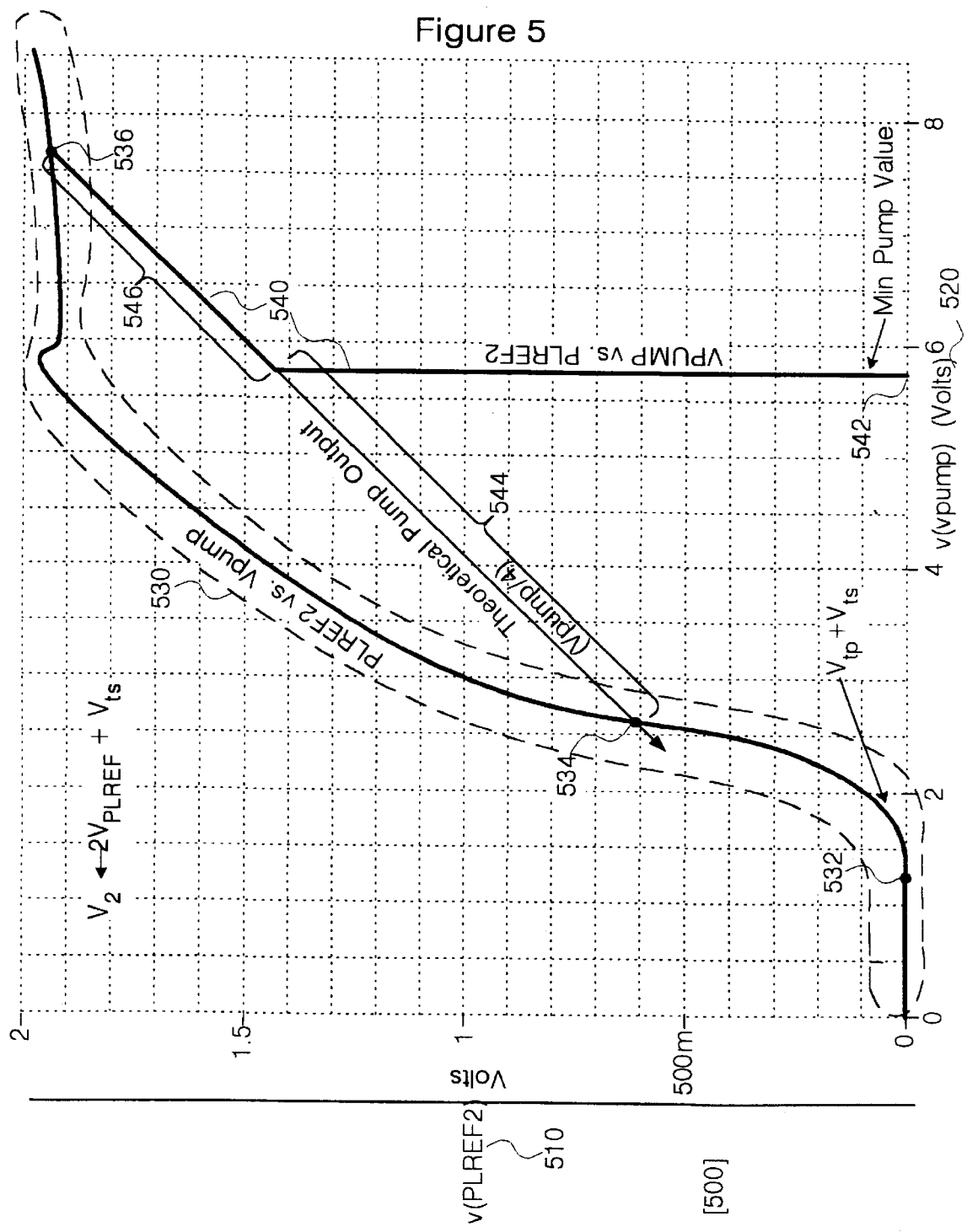

PUMP SUPPLY SELF REGULATION FOR FLASH MEMORY CELL PAIR REFERENCE CIRCUIT

BACKGROUND OF THE INVENTION

1. Field of the Invention

This invention relates to computer systems and, more particularly, to self regulation of the output voltage of a pump power supply used for a flash memory cell pair reference circuit in generating reference voltages for reading, programming, and erasing flash electrically-erasable programmable read only memory (flash EEPROM) arrays.

2. History of the Prior Art

There has been a recent trend to reducing the power requirements of portable computers. In order to lower power consumption, much of the integrated circuitry used in personal computers is being redesigned to function at lower voltage levels. Some of the circuitry used in portable computers are being designed to operate at low voltage levels such as 5 volts and 3.3 volts. This helps to reduce the power needs of such computers.

Unfortunately, some devices used in portable computers require higher voltages. Flash electrically erasable programmable read only memory (flash EEPROM memory) has recently been used to store the basic input/output startup (BIOS) processes for personal computers. This memory may be erased and reprogrammed without being removed from the computer by running an update program when the BIOS processes are to be changed. However, in order to erase and reprogram flash EEPROM memory, approximately twelve volts, a voltage level not readily available from the lower voltage batteries provided in portable computers, is required.

Flash EEPROM memory array has also been used in personal computers as a type of long term random access storage. For example, a flash EEPROM memory array may be used in place of a hard disk drive is described in U.S. patent application 07/969,131, entitled "A Sector Based Storage Device Emulator Having Variable-Sized Sector", S. Wells, filed Oct. 30, 1992, and assigned to the assignee of the present invention. Such a flash memory array provides a smaller, lighter, functionally equivalent of a hard disk drive and is not as sensitive to physical damage. Such a flash memory array would be especially useful in portable computers, where space and weight are important considerations. However, these flash EEPROM memory arrays also require much higher voltages and substantially more power than that directly available from the batteries of low power portable computers.

In some electronic devices, charge pump circuits have been used to provide a high voltage from a lower voltage source. Recently, charge pumps have been integrated with flash arrays to supply voltages needed to accomplish erase and program operations of flash memory when such voltages are not available from an external source. One example of such a charge pump arrangement for providing high voltages to a flash EEPROM memory array is disclosed in detail in U.S. Pat. No. 5,414,669 entitled "Method And Apparatus For Programming And Erasing Flash EEPROM Memory Arrays Utilizing A Charge Pump Circuit", K. Tedrow et al, issued May 9, 1995, and assigned to the assignee of the present invention.

However, erasing and programming the cells of a flash EEPROM memory array requires very accurate voltages. The voltages provided by charge pumps and other circuitry implemented as part of integrated circuits, including voltage reference circuits, typically vary due to factors such as operating temperatures, supply voltages, process variations, and load currents. Moreover, when charge pumps are used to supply the voltage, the voltage level provided at the output terminal of a charge pump tends to vary substantially from a desired voltage value. Reference voltages may be used to regulate the output voltage of charge pumps. One example of a reference voltage used in a regulation circuit for a charge pump is described in U.S. Pat. No. 5,553,295 entitled "Method And Apparatus For Regulating The Output Voltage of Negative Charge Pumps", D. Pantelakis et al, issued Sep. 3, 1996, and assigned to the assignee of the present invention.

Precision voltage references are well known in prior art and there have been many circuit arrangements for providing such references. However, as applications of such voltage references have changed, so has the requirements for voltage reference circuits. For example, it is necessary to generate very high precision voltage references within the integrated circuit which contains a flash EPROM memory array or its control circuitry. Furthermore, the circuit elements needed for providing the high precision voltage reference must be produced by the same process used in manufacturing the flash EEPROM memory array. An example of a precision voltage reference circuit produced by the process used in manufacturing flash memory is disclosed in detail in U.S. Pat. No. 5,339,272 entitled "Precision Voltage Reference", K. Tedrow et al, issued Aug. 16, 1994, and assigned to the assignee of the present invention. Other requirements of the reference circuit include lower power consumption and minimal output variation. In order to increase the power supply rejection of the voltage reference circuit and decrease the supply current, it is necessary to regulate the charge pump supply for the flash pair voltage reference circuit. However, as die size is an important factor in designing and manufacturing integrated circuits, the circuitry necessary to regulate the charge pump supply needs to be minimal. It is therefore desirable to have a voltage regulation circuit that provides minimal output variation and is not affected by variations in operating temperature, supply voltage, process, or load current. Furthermore, the circuit must be produced using the same process used to produce a flash EEPROM memory array.

SUMMARY OF THE INVENTION

An integrated circuit arrangement which provides a flash pair regulated pump supply for a flash EEPROM memory cell pair reference circuit. The pump regulation uses an output voltage from the flash pair circuit as a reference voltage. The integrated circuit arrangement includes: a charge pump circuit; a source of reference voltages; a comparator for comparing an output of the charge pump with a reference voltage and for operating the charge pump based on its output; and a pass device for coupling an output of the charge pump to the comparator.

BRIEF DESCRIPTION OF THE DRAWINGS

The present invention is illustrated by way of example and not limitations in the figures of the accompanying drawings in which like references indicate similar elements, and in which:

FIG. 5 is a graph illustrating the relationship between the potentials of certain nodes during the operation of one embodiment of a circuit implementing the present invention.

DETAILED DESCRIPTION

An integrated circuit arrangement comprising a charge pump that provides a power supply voltage to a voltage reference circuit and also to a feedback and control circuit coupled to the charge pump is disclosed. The voltage reference circuit provides a reference voltage output and a control voltage for the feedback circuit. In the following description, for purposes of explanation, specific nomenclature is set forth to provide a thorough understanding of the present invention. However, it will be apparent to one skilled in the art that these specific details are not required in order to practice the present invention. For example, the circuit of the present invention is described with reference to a flash memory device. However, the teachings of the present invention can easily be applied to other types of electronic circuit applications.

An intended advantage of one embodiment described below is to self regulate a pump supply for a flash memory cell pair reference circuit. Another object of the present invention is to provide regulation for a pump supply of a flash pair voltage reference circuit by using a reference voltage generated by the reference circuit as the reference for regulation. Other intended advantages of one or more embodiments may include: decreasing reference output variation for a flash pair reference circuit, providing a protection mechanism so as to not allow multiple operating points of a flash pair voltage reference circuit when its reference output regulates a power supply for itself; reducing the ICC current of a flash pair reference circuit; and/or allowing a larger VCC range since high VCC values will not cause the supply pump output voltage to go so high as to cause voltage stress problems in the reference circuit because the pump output voltage is regulated.

A Computer System Application

Figure 1:
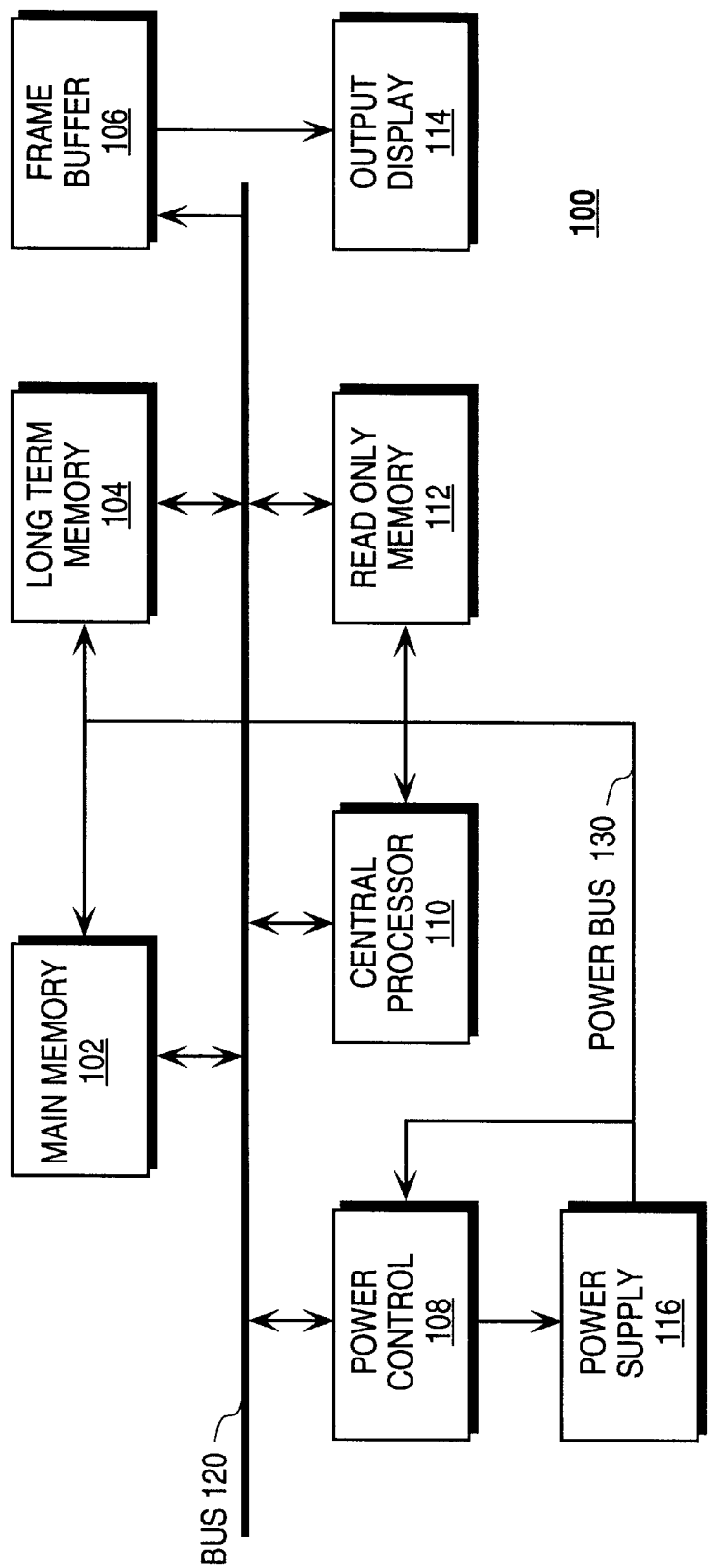
FIG. 1 is a block diagram illustrating a computer system which may utilize the present invention.

Referring now to FIG. 1, there is illustrated a computer system 100. The system 100 includes a central processor 110 which carries out the various instructions provided to the computer 100 for its operations. The central processor 110 is joined to a bus 120 adapted to carry information to various components of the system 100. Jointed to the bus 120 is main memory 102 which is typically constructed of dynamic random access memory arranged in a manner well known to those skilled in the prior art to store information during a period in which power is provided to the system 100. Also joined to the bus 120 is read only memory 112 which may include various memory devices well known to those skilled in the art each of which is adapted to retain a particular memory condition in the absence of power to the system 100. The read-only memory 112 typically stores various basic functions used by the processor 110 such as basic input/output processes and startup processes typically referred to as BIOS processes. Such read-only memory 112 may be constructed of flash EEPROM memory cells adapted to be modified as various ones of the BIOS processes used by a particular computer are changed. If the read-only memory 112 is constructed of flash EEPROM memory cells, it may be modified by running an update process on the computer itself to reprogram the values stored in the read-only memory 112. Typically, such flash EEPROM memory will include circuitry for programming an erasing the memory array.

Also connected to the bus 120 are various peripheral components such as long term memory 104 and circuitry such as a frame buffer 106 to which data may be written which is to be transferred to an output device such as a monitor 114 for display. The construction and operation of long term memory 104 (typically electro-mechanical hard disk drives) is well known to those skilled in the art. However, rather than the typical electro-mechanical had disk drive, a flash EEPROM memory array may be used as the long term memory 104. Such flash EEPROM memory arrays are programmed and erased through techniques which utilize voltages greater than those typically available to the integrated circuits of more advanced portable computers. Such flash EEPROM memory arrays typically include circuitry for programming and erasing the memory array. Consequently, in accordance with the present invention, such long term memory arrays as well as memory 112 may provide circuitry for generating high voltages from the lower voltages available from the batteries typically utilized with such computers. In order to generate accurate high voltages for programming and erasing such flash EEPROM memory arrays the present invention introduces voltage regulation circuitry needed to generate precise programming voltages.

Circuitry is also show in FIG. 1 by which power may be supplied through a power bus 130 to various components of the system 100. This includes in the exemplary embodiment a power control circuit 108 which controls the various states for applying power to the system 100 and a battery 116 which may be utilized in a portable computer for furnishing power to the system 100 under control of the power control circuitry 108. In any particular arrangement, the power control circuitry 108 may actually be a part of a particular portion of the circuit of FIG. 1. For example, if the read only memory were to be constructed of flash EEPROM memory devices, power control circuitry 108 including voltage reference circuitry in accordance with the present invention might be a physical portion of the read only memory block.

A Self Regulated Charge Pump Circuit

Figure 2:
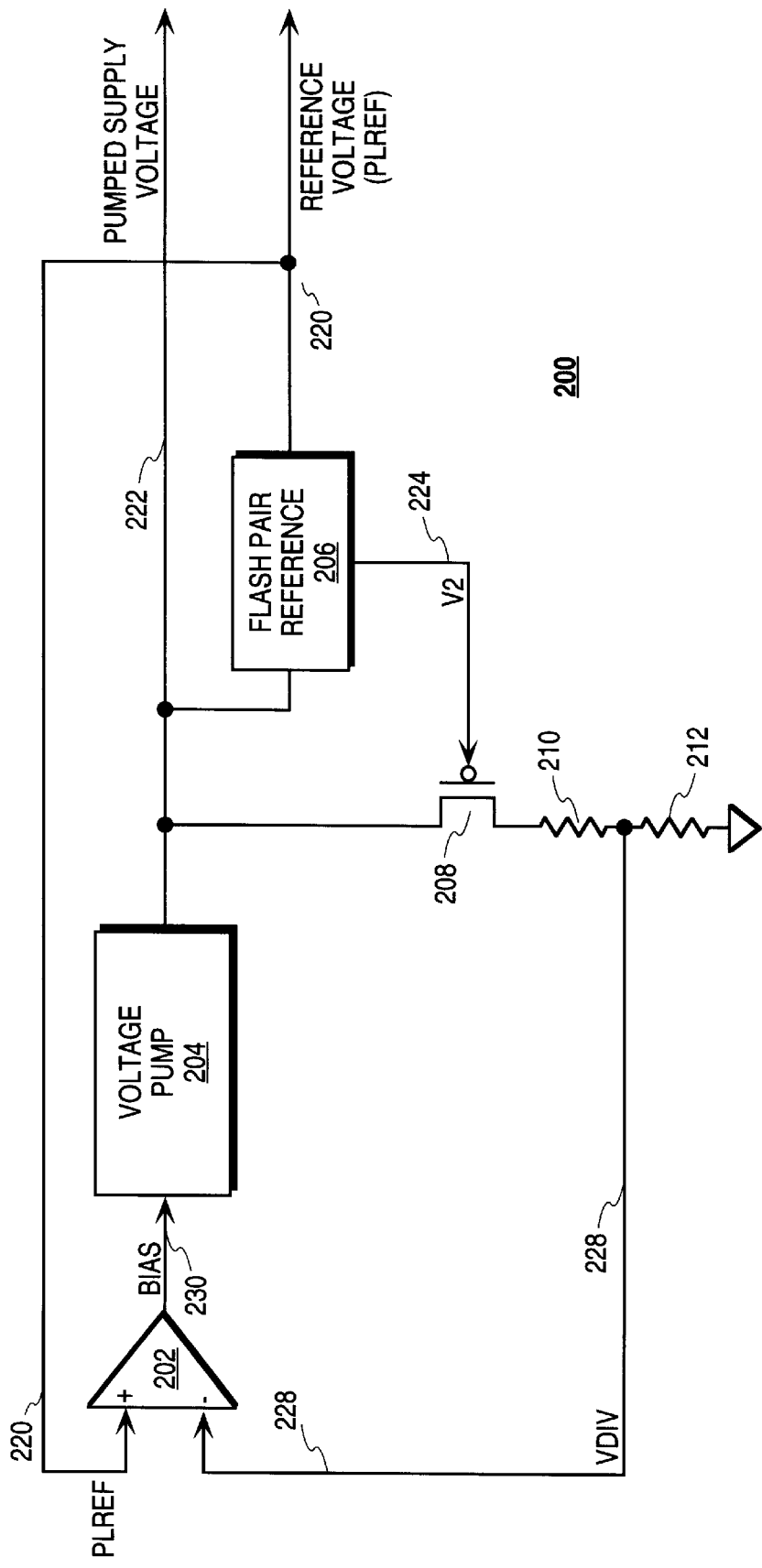
FIG. 2 is a block diagram of a circuit for one embodiment for implementing the present invention.

FIG. 2 is a block diagram of a circuit for one embodiment for providing the present invention. The circuit 200 provides pump supply self regulation for a flash memory cell pair reference circuit. This circuit arrangement 200 includes a voltage charge pump circuit 204 providing a pumped supply potential at an output terminal 222. This pumped supply potential is connected to a flash EEPROM pair voltage reference circuit 206 and to the source terminal of a P type transistor 208. The flash pair reference circuit 206 provides a reference output potential at terminal 220. The voltage at the output terminal 220 is the reference voltage controlled by the voltage reference circuit 206.

In the embodiment of FIG. 2, a P type transistor 208 is used as a pass device to pass the output 222 of a voltage charge pump circuit 204. Other possible embodiments of the present invention may utilize a N type transistor with a low threshold voltage or another form of a pass gate to serve as the pass device in passing the output 222 of a voltage charge pump.

A flash EEPROM memory device (cell) is a floating gate MOS field effect transistor having a drain region, a source region, a floating gate, and a control gate. Conductors are connected to each drain, source, and control gate for applying signals to the transistor. A flash EEPROM cell is capable of functioning in the manner of a normal EPROM cell and will retain a programmed value when power is removed from the circuitry. A flash EEPROM cell may typically be used to store a one or zero condition. If multilevel cell (MLC) technology is used, multiple bits of data more be stored in each flash EEPROM cell. Unlike a typical EPROM cell, a flash EEPROM cell is electrically erasable in place and does not need to be removed and diffused with ultraviolet to accomplish erasure of the memory cells.

Arrays of such flash EEPROM memory cells have been used in computers and similar circuitry as both read only memory and as long term storage which may be both read and written. These cells require accurate values of voltage be furnished in order to accomplish programming and reading of the devices. Arrays of flash EEPROM memory devices are typically used for long term storage in portable computers where their lightweight and rapid programming ability offer distinct advantages offer electro-mechanical hard disk drives. However, the tendency has been to reduce the power requirements of such portable computers to make the computers lighter and to increase the length of use between recharging. This has required that the voltage potentials available to program the flash memory arrays be reduced. In the past, precision voltage references had long been available in circuitry within portable computers for use in programming flash arrays. However, this is no longer true with new low power portable computer systems. Therefore, it is now necessary to generate such precision voltage references within the circuitry for controlling the flash EEPROM memory array. High precision voltage references are also useful for providing faster program/erase times and better reliability of the flash EEPROM cells.

The flash pair voltage reference 206 also provides a second output voltage at another output terminal 224 and is connected to the gate terminal of the P type device 208. This second voltage output controls the operation of a pass gate. In the embodiment of FIG. 2, the pass gate is a P type transistor device 208. If the potential at output terminal 224 drops, then the current from the pump output terminal 222 through the P type transistor device 208 is increased. On the other hand, if the potential at output terminal 224 increases, then the current from the pump output terminal 222 through the P type transistor device 208 decreases.

The P type transistor device 208 has its drain terminal connected in series with a voltage divider. The voltage divider in the embodiment of FIG. 2 is formed with a pair of resistors 210 and 212. The resistor 210 is one-half the value of the resistor 212 in one embodiment of the voltage divider. Since the resistor 210 is one-half the value of the resistor 212, the voltage difference between the charge pump output terminal 222 and ground divides so that the negative input 228 of the comparator 202 receives two-thirds of the voltage of the pumped supply voltage. The output potential at terminal 220 of the flash pair reference circuit 206 is connected to the positive of the comparator 202. The output terminal 230 of comparator 202 controls the charge pump in response to the difference between the comparator 202 inputs. When the voltage (Vdiv) at the negative input 228 of the comparator 202 drops below the reference level at the positive input 220, the charge pump output current and output voltage are increased. The operation of the charge pump is interrupted when the divided down voltage (Vdiv) produced by the charge pump 204 becomes greater than the reference at the positive input 220 of the comparator 202.

In one embodiment, a divided version (Vdiv) of a charge pump output 222 is connected to the negative input 228 of the comparator 202 and compared with the reference voltage connected to the positive input 220 because the output potential 222 of charge pump 204 is much greater than the potential of the reference voltage 220 during normal operation of the circuit 200. In an alternate embodiment, the undivided output of the charge pump 204 may be directly compared with the reference voltage at the positive terminal 220 such that the charge pump output 204 and the reference voltage 220 are driven to be equal during normal operation of the circuit 200.

A First Voltage Reference Circuit

Figure 3:
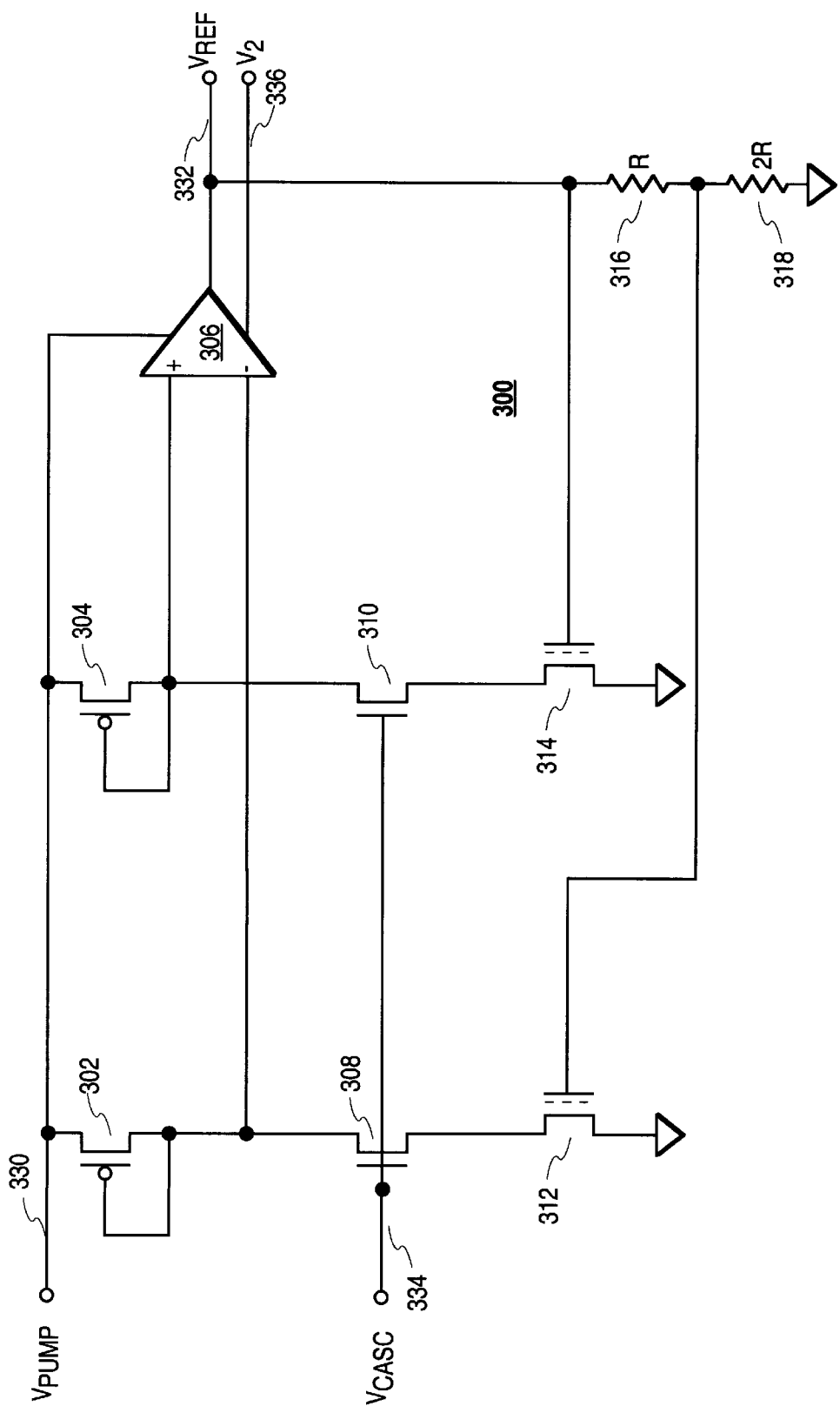
FIG. 3 is a circuit diagram for one embodiment of a precision flash pair voltage reference circuit which may be used in the circuit of FIG. 2 to provide reference voltages.

FIG. 3 illustrates a circuit diagram for one embodiment of a precision flash pair voltage reference circuit which may be used in the voltage reference circuit of FIG. 2 to provide reference voltages. The voltage reference circuit 300 is especially useful in explaining the manner of operation of a flash pair reference circuit. The voltage reference circuit 300 includes a pair of essentially identical flash EEPROM devices 312 and 314.

The flash EEPROM cells 312 and 314 should not be considered as memory array cells even though they are constructed in the same manner using the same processes. Cells 312 and 314 are used to store two different selected charge values rather than the charge values typically used for such devices. The flash cell 312 has its source terminal connected in series with the drain terminal of a N type transistor 308. The source terminal of a N type transistor 308 is coupled to the drain terminal of a P type transistor 302. The P type transistor 302 has its gate terminal connected to its drain terminal so that it functions like a resistor and its source terminal connected to the charge pumped supply voltage 330. The N type device 308 is a cascode device used to maintain the voltage at the drain terminal of the flash device 312 at a voltage which is a threshold voltage Vt of the device 308 below the gate voltage of the cascode device 308.

The flash device 314 has its source terminal connected in series with the drain terminal of a N type device 310. The source terminal of a N type device 310 is coupled to the drain terminal of a P type transistor 304. The P type transistor 304 is sized identically to the P type transistor 302 and has its gate terminal connected to its drain terminal so that P type transistor 304 also functions like a resistor and its source terminal connected to the charge pumped supply voltage 330. The N type device 310 is a cascode device identical to the cascode device 308 and is also used to maintain the voltage at the drain terminal of the flash device 314 at a voltage which is a voltage Vt below the gate voltage of the cascode device 310. The gate terminal of both N type devices 308 and 310 is connected to cascode voltage VCASC 334.

The drain terminal of the P device 302 is connected to the negative input of a differential amplifier 306 while the drain terminal of the P device 304 is connected to the positive input of the differential amplifier 306. The amplifier 306 which is also connected to a pumped supply 330 provides an output potential at a terminal 332 which may be measured above ground potential across a pair of resistors 316 and 318. The voltage at the output terminal 332 is the reference voltage controlled by the circuit 300. The resistor 316 is one-half the value of the resistor 318 in one embodiment of the flash pair voltage reference circuit. The amplifier 306 also provides a control voltage (V2) 336 which may be used to control the connection of a charge pump output to a voltage divider as previously described above for FIG. 2. In that embodiment, control voltage 336 may be connected to the gate terminal of P type transistor 208.

Since the resistor 316 is one-half the value of the resistor 318, the voltage difference between the output terminal 332 and ground divides so that the gate of the flash cell 312 receives two-thirds of the voltage which the gate of the flash cell 314 receives. During manufacture, each of the flash cells 312 and 314 is programmed to hold a different charge on its respective floating gate. The values of the charges are selected such that when the voltage reference circuit 300 is in equilibrium, it provides the desired output value to be used as a reference voltage, and the currents through the two flash devices are equal, and the drain voltages provided by the resistor divider network of resistors 316 and 318 are just appropriate to maintain the equal current through the two cells 312 and 314. This means that the threshold voltage Vt of the cell 314 is greater than the threshold voltage Vt of the cell 312. In fact, this is the way in which the cells 312 and 314 are programmed so that when the voltage at the gate of the cell 312 is two-thirds that of the voltage at the gate of the cell 314, equal currents are produced.

If the output reference voltage shifts, this must be because the current through one of the two flash devices has changed. For example, if the current through the device 312 increases, then the current through and the voltage across the transistor 302 must also increase. This lowers the level of the voltage at the drain of the transistor 302 and at the negative input of the amplifier 306. This applies a larger voltage across the differential inputs to the amplifier 306 and causes a positive change, and increase, in the output voltage of the amplifier 306. This, in turn, will raise the voltage level at the gate terminals of the flash cells 312 and 314. The voltage at the gate terminal of the cell 314 is changed by a proportionately greater amount than is the gate terminal of the cell 312. This increased gate voltage increases the current through the flash cell 314 and the P transistor 304 thereby lowering the voltage at the drain terminal of the transistor 304 and at the positive input to the amplifier 306 and counteracting the original increase in current through device 312. A change in another sense through either of the cells 312 or 314 will have a similar effect in balancing the current and maintaining the output voltage at the equilibrium reference output level.

A Second Voltage Reference Circuit

Figure 4:
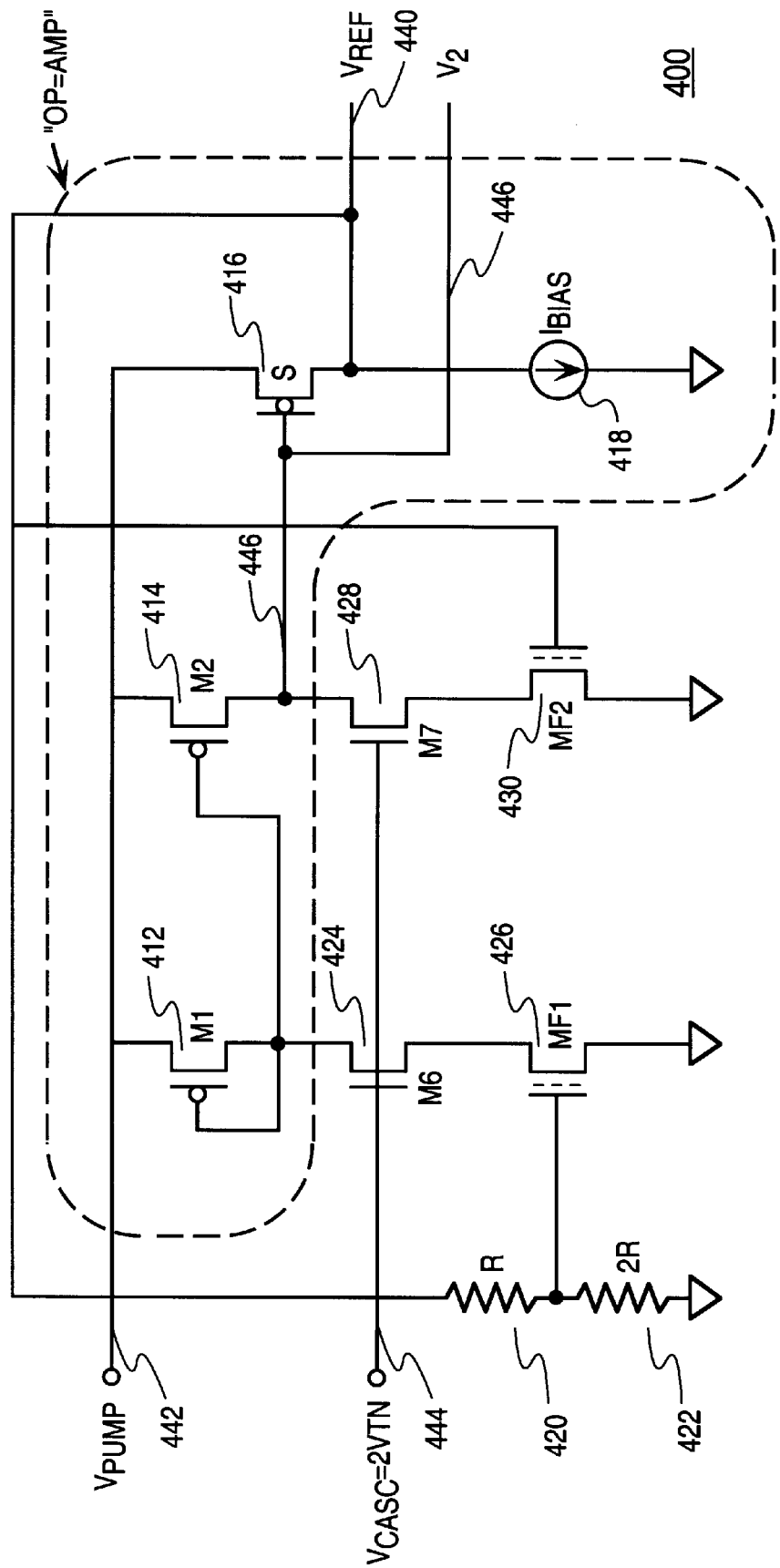
FIG. 4 is a circuit diagram for another embodiment of a precision flash pair voltage reference circuit which may be used in the circuit of FIG. 2 to provide reference voltages.

FIG. 4 is a circuit diagram for another embodiment of a precision flash pair voltage reference circuit that may be used in the circuit of FIG. 2 to provide the reference voltages. The circuit 400 of FIG. 4 includes a pair of essentially identical flash EEPROM devices 426 and 430. Cells 426 and 430 are used to store two different selected charge values rather than the charge values typically used for such devices. The flash cell 426 has its source terminal connected in series with the drain terminal of a N type transistor 424. The source terminal of N type transistor 424 is coupled to the drain terminal of a P type transistor 412. The P type transistor 412 has its gate terminal connected to its drain terminal so that it functions like a resistor and its source terminal connected to a pumped supply 442. The gate terminal of N type device 424 is connected to cascode voltage VCASC 444.

The flash cell 430 has its source terminal connected in series with the drain terminal of a N type transistor 428. The source terminal of a N type transistor 428 is coupled to the drain terminal of a P type transistor 414. The P type transistor 414 is sized identically to the P type transistor 412 and has its gate terminal connected to the drain terminal of transistor 412 so that it functions like a current mirror. The source terminal of transistor 412 is connected to a charge pumped supply voltage 442. The N type transistor 428 is a cascode device identical to the cascode transistor 424 and is also used to maintain the voltage at the drain terminal of the flash cell 430 at a voltage which is a voltage Vt below the gate voltage of the cascode transistor 424. Similarly, the gate terminal of N type device 428 is connected to cascode voltage VCASC 444.

The drain terminal of the P device 414 is connected to the gate of a low threshold N-channel transistor 416 at node 446. The voltage (V2) at node 446 may be used to control may be used to control the connection of a charge pump output to a voltage divider as previously described above for FIG. 2. In that embodiment, control voltage 446 may be connected to the gate terminal of P type transistor 208. The drain terminal of low threshold N-channel device 416 is connected to a charge pumped supply voltage 442 and the source terminal is connected to a current source 418. The low threshold N-channel device 416 provides an output potential at its source terminal 440 which may be measured above ground potential across a pair of resistors 420 and 424. The voltage at the output terminal 440 is the reference voltage controlled by the circuit 400. The resistor 420 is one-half the value of the resistor of the value of the resistor 422 in one embodiment of the voltage reference circuit. The P devices 412 and 414, low threshold N-channel device 416, and current source 418 form a circuit 410 which functions as an operational amplifier.

Since the resistor 420 is one-half the value of the resistor 422, the voltage difference between the output terminal 440 and ground divides so that the gate of the flash device 426 receives two-thirds of the voltage which the gate of the flash device 430 receives. During manufacture, each of the flash devices is programmed to hold a different charge on its floating gate. The values of the charges are selected such that when the circuit 400 is in equilibrium providing the desired output value to be used as a reference voltage, the currents through the two flash devices are equal, the drain voltages provided by the resistor divider network of resistors 420 and 422 are just appropriate to maintain the equal current through the two devices 426 and 430. This means that the threshold voltage Vt of the device 430 is greater than the threshold voltage Vt of the device 426, and this is in fact the way in which the devices 426 and 430 are programmed so that when the voltage at the gate of the device 426 is two-thirds that of the voltage at the gate of the device 430, equal currents are produced.

Performance of A Self Regulated Charge Pump Circuit

FIG. 5 is a graph illustrating the relationship between the potentials of certain nodes during the operation of one embodiment of a circuit implementing the present invention. The graph 500 is a plot of a reference voltage output from the flash pair reference circuit versus an voltage output of the voltage charge pump. The graph 500 of FIG. 5 consists of an X-axis 520 indicating the voltage value of node VPUMP and a Y-axis 510 indicating the voltage value of node PLREF2.

The "PLREF2 vs. VPUMP" waveform 530 plots the relationship of the potential at node PLREF2 as the node at VPUMP changes in potential. The "PLREF2 vs. VPUMP" waveform starts ramping up from a PLREF2 potential of zero volts at point 532 on the X-axis. At point 532, node VPUMP 442 has reached a potential of [VTP+VTS].

The "VPUMP vs. PLREF2" waveform 540 plots the relationship of the potential at node VPUMP versus the potential at node PLREF2 varies. The dotted line segment 544 plots an extrapolation of the theoretical output potential of the charge pump as the potential at node PLREF2 increases. At point 542 on the graph, the flash pair circuit reaches equilibrium and V2 node 224 forces the P type device 208 to start controlling the feedback from the charge pump output 222 to the comparator 202. The voltage charge pump 204 then operates in a regulated mode when VPUMP is above the minimum pump value 542 and the actual output of the charge pump matches with the theoretical pump output as in section 546 of the "VPUMP vs. PLREF2" waveform 540. When the potential at the output 222 of the charge pump is below the designed minimum pump value such as the region of VPUMP to the left of point 542, the charge pump 204 operates at its maximum frequency until the flash pair circuit reaches equilibrium and the charge pump starts using the V2 potential 224 to regulate the performance of the charge pump 204.

The "PLREF2 vs. VPUMP" waveform 530 and "VPUMP vs. PLREF2" waveform 540 cross at the crossover points of 534 and 536. The first crossover point 534 is a bad area since the charge pump may operate in an erroneous manner. Since the VPUMP potential at charge pump output 222 is below the minimum pump value 542 at this operating point, the V2 voltage 224 has not yet enabled the feedback loop at the P type device 208 and the charge pump 204 is pumping at its maximum frequency. The second crossover point 536 is a good crossover point. It is the desired operating point of the charge pump at equilibrium.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative than a restrictive sense.

What is claimed is:

1. A circuit providing pump supply self regulation, said circuit comprising:
   a reference circuit coupled to a charge pump circuit, wherein said charge pump circuit furnishes a pump output voltage at its output terminal, and said reference circuit furnishes a reference voltage and an control voltage;
   a pass device comprising an input terminal, an output terminal, and a control terminal, said pass device coupled to an output terminal of said charge pump at said input terminal, and passing said pump output voltage based on voltage potential of said control voltage which is coupled to said control terminal of said pass device;
   a voltage divider circuit coupled to said output terminal of said pass device and a ground potential, and furnishing a divided voltage; and
   a comparison circuit coupled to said charge pump, wherein said comparison circuit compares potential of said divided voltage and potential of said reference voltage and operates said charge pump in response to differences between said divided voltage and said reference voltage.

2. A circuit providing pump supply self regulation as claimed in claim 1 wherein said comparison circuit is a comparator.

3. A circuit providing pump supply self regulation as claimed in claim 1 wherein said comparison circuit is a differential amplifier.

4. A circuit providing a pump supply self regulation as claimed in claim 1 wherein said comparison circuit is a differential amplifier.

5. A circuit providing pump supply self regulation as claimed in claim 1 wherein said reference circuit is a flash EEPROM memory cell pair reference circuit.

6. A circuit providing pump supply self regulation as claimed in claim 1 wherein said pass device is a P type transistor.

7. A circuit providing pump supply self regulation as claimed in claim 1 wherein said pass device is a N type transistor.

8. A circuit providing pump supply self regulation as claimed in claim 1 wherein said voltage divider circuit comprises of a resistor divider.

9. A method of providing pump supply self regulation, said method comprising the steps:
   generating a pumped supply output voltage from a charge pump;
   generating a reference voltage from a reference circuit;
   controlling a coupling between said pumped supply output voltage to a voltage divider;
   dividing said pumped supply output voltage with said voltage divider into a divided output voltage;
   comparing said divided output voltage with a reference voltage; and
   controlling operation of said charge pump based on result of a comparison of said divided output voltage with said reference voltage.

10. A method of providing pump supply self regulation as claimed in claim 9 wherein said step of generating a reference voltage from a reference circuit is performed by a flash EEPROM memory cell pair reference circuit.

11. A method of providing pump supply self regulation as claimed in claim 9 wherein said step of comparing said divided output voltage with a reference voltage is performed by a differential amplifier.

12. A method of providing pump supply self regulation as claimed in claim 9 wherein said step of comparing said divided output voltage with a reference voltage is performed by a operational amplifier.

13. A method of providing pump supply self regulation as claimed in claim 9 wherein said step of controlling a coupling between said pumped supply output voltage to a voltage divider is performed by a P type transistor.

14. A method of providing pump supply self regulation as claimed in claim 9 wherein said step of controlling a coupling between said pumped supply output voltage to a voltage divider is performed by a N type transistor.

15. A method of providing pump supply self regulation as claimed in claim 9 wherein said step of dividing said pumped supply output voltage is performed by a resistor divider.

16. A computer system, comprising:
   a central processor;
   a system bus coupled to said processor;
   a main memory coupled to said system bus; and
   a programmable non-volatile long term memory coupled to said system bus, further comprising
      a flash EEPROM memory array;
      a flash EEPROM memory cell pair reference circuit for furnishing reference voltages for operating said flash EEPROM memory array; and
      a circuit providing pump supply self regulation that further comprises
         a charge pump circuit coupled to a reference circuit, wherein said charge pump furnishes a pump output voltage at its output terminal, and said reference circuit furnishes a reference voltage and a control voltage;
         a pass device comprising an input terminal, an output terminal, and a control terminal, said pass device coupled to an output terminal of said charge pump at said input terminal, and passing said pump output voltage based on voltage potential of said control voltage which is coupled to said control terminal of said pass device a voltage divider circuit coupled to said output terminal of said pass device and a ground potential, and furnishing a divided voltage; and a comparison circuit coupled to said charge pump, wherein said comparison circuit compares potential of said divided voltage and potential of said reference voltage and operates said charge pump in response to difference between said divided voltage and said reference voltage.

17. A computer system as claimed in claim 16 wherein said reference circuit in said circuit providing pump supply self regulation is a flash EEPROM memory cell pair reference circuit.

18. A computer system as claimed in claim 16 wherein said pass device in said circuit providing pump supply self regulation is a P type transistor.

19. A computer system as claimed in claim 16 wherein said pass device in said circuit providing pump supply self regulation is a N type transistor.

20. A computer system as claimed in claim 16 wherein said voltage divider circuit in said circuit providing pump supply self regulation is a resistor divider.

21. A computer system as claimed in claim 16 wherein said comparison circuit is a operational amplifier.

22. A computer system as claimed in claim 16 wherein said comparison circuit is a differential amplifier.

23. A method of regulating a pump supply, said method comprising the steps:

generating a pumped supply output voltage from a charge pump;

generating a reference voltage from a reference circuit coupled to said charge pump;

coupling said pumped supply output voltage to a first input of a comparator, wherein output of said comparator is coupled to said charge pump;

coupling said reference voltage to a second input of said comparator;

comparing said pumped supply output voltage with said reference voltage; and controlling operation of said charge pump based on result of comparison of said pumped supply voltage and said reference voltage.

24. A method of regulating a pump supply as claimed in claim 23 wherein said step of coupling said pumped supply output voltage to a first input of a comparator further comprises passing said pumped supply output voltage through a pass device, wherein said pass device is controlled by a control voltage generated by said reference circuit.

* * * * *